May 19, 1959 H. P. KELLY 2,887,541

AUTOMATIC GAIN CONTROL

Original Filed Jan. 30, 1953

INVENTOR
H. P. KELLY
BY W. L. Keefauver
ATTORNEY

United States Patent Office 2,887,541
Patented May 19, 1959

2,887,541

AUTOMATIC GAIN CONTROL

Hugh P. Kelly, Watchung, N.J., assignor to Bell Telephone Laboratories, Incorporated, New York, N.Y., a corporation of New York Original application January 30, 1953, Serial No. 334,293, now Patent No. 2,760,155, dated August 21, 1956. Divided and this application November 21, 1955, Serial No. 548,108

7 Claims. (Cl. 179—171)

This invention relates to delayed automatic gain control circuits and more specifically to such circuits in which the automatic gain control voltage is amplified before being applied as a bias to the controlled amplifier. This application is a division of my application Serial No. 334,293, filed January 30, 1953, now Patent No. 2,760,155 dated August 21, 1956.

It is an object of this invention to maintain constant the output level of a vacuum tube amplifier to a high degree of precision despite fluctuations in the level of the input signal.

It is a further object of this invention to produce an automatic gain control voltage which is capable of being amplified on an alternating-current basis.

It is a still further object of this invention to eliminate the need for direct-current amplification of the automatic gain control voltage.

In one specific embodiment of the invention given by way of example for purposes of illustration, a portion of the output of the controlled amplifier is detected. The detected output is then converted into a square wave of the same peak-to-peak amplitude as the detected output, amplified, and compared on a peak-to-peak basis with a direct-current reference voltage in a novel diode circuit. Finally, the portion of the square wave exceeding the direct-current reference voltage is amplified on an alternating-current basis, rectified and applied as a bias to the control grid of the controlled amplifier.

In another specific embodiment given by way of example, a portion of the alternating-current output of a multistage amplifier is amplified, and, in a manner similar to that outlined above, a delayed amplified automatic gain control voltage is developed which may be applied as a grid bias to one or more stages of the controlled amplifier.

It is to be understood that the "delay" in delayed automatic gain control refers to voltage delay, and not time delay. A delayed automatic gain control system is one which does not come into operation, that is, it is delayed, until the signal being controlled reaches a predetermined threshold level.

A feature of the invention is that, since amplification is accomplished on an alternating-current basis, this system is considerably more stable than conventional systems using direct coupled amplifiers which are subject to contact potential drifts, and avoids the power supply complications which are inherent in direct-current amplifier designs.

Figure 1:
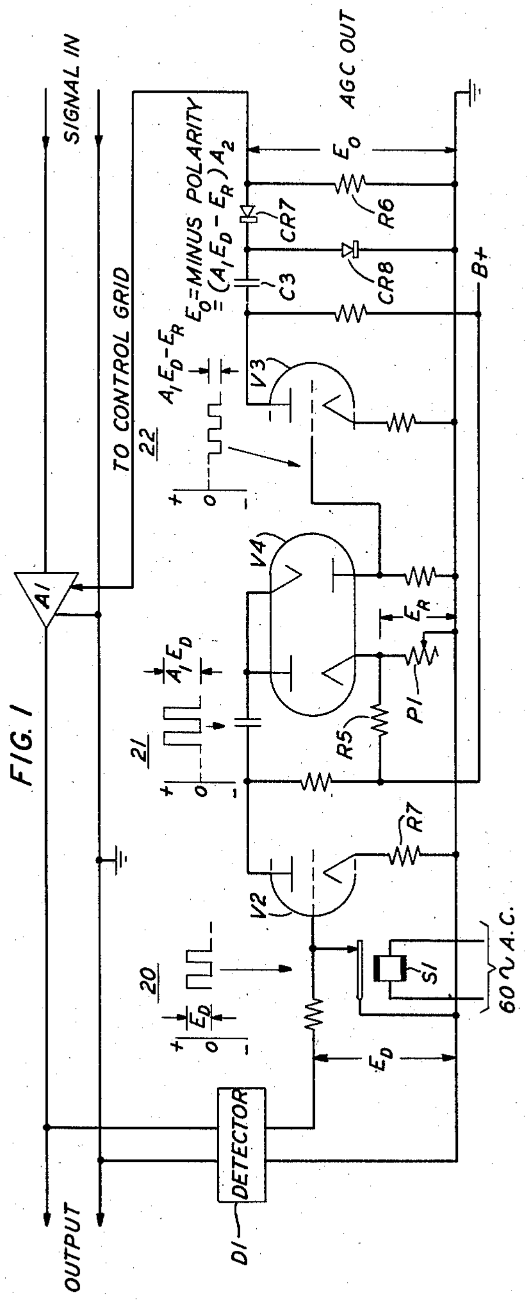
Figure 2:
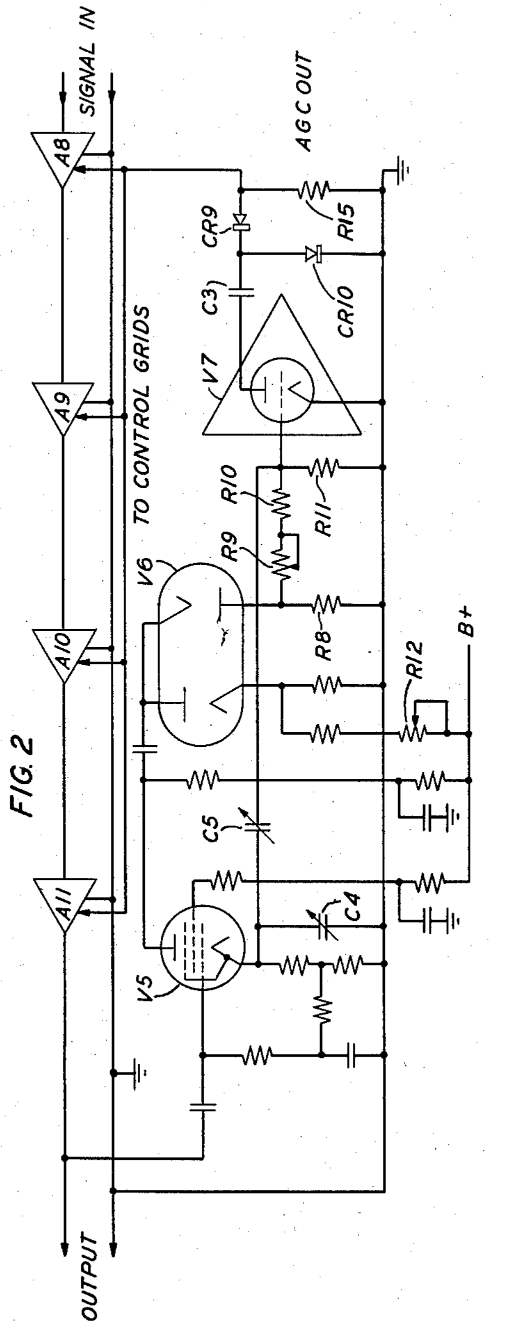

The invention will be more readily understood by referring to the following description taken in connection with the accompanying drawings, in which:

Fig. 1 is a schematic diagram of a delayed automatic gain control circuit in accordance with the invention wherein the automatic gain control voltage is derived from the detected output of the controlled amplifier; and Fig. 2 is a schematic diagram of a delayed automatic gain control circuit in accordance with the invention applied to a multistage amplifier.

Referring now to the drawings, Fig. 1 shows a delayed automatic gain control circuit in accordance with the invention adapted to maintain constant the output voltage of a broadband amplifier such as he signal and beat frequency amplifiers designated A3 and A4 in Fig. 1 of the parent application. The controlled amplifier is indicated in Fig. 1 of this application by the triangle A1, and the detector bridged across the output of amplifier A1 is indicated by the block D1, from which a direct-current output voltage $E_D$ is derived.

As shown in Fig. 1, this automatic gain control circuit includes a vibrating relay S1, the three-electrode amplifying vacuum tube stages V2 and V3, which may be included in a common envelope, and a twin diode V4. The direct-current voltage output of the detector D1 at the point to be controlled is interrupted by the relay S1 at a sixty-cycle rate from a sixty-cycle vibrating source (not shown). The resulting sixty-cycle square waves have a peak-to-peak amplitude which is equal to the amplitude $E_D$ of the direct-current signal received from the associated detector as shown in the waveform diagram 20 in Fig. 1.

These square waves are amplified in the amplifying stage V2, which has a gain of $A_1$. The output of V2, as shown in diagram 21, is compared on a peak-to-peak basis with a direct-current reference voltage in the diode circuit V4. No transmission takes place through the diode circuit V4 until the peak-to-peak value of the square wave applied to it exceeds the reference voltage which is applied, as shown, as a bias $E_R$ through resistor R5 to one of the cathodes of the diode circuit V4. However, when the amplitude of the square wave exceeds the value of the reference voltage $E_R$, the difference in amplitude between this wave and the reference voltage (shown in diagram 22) is transmitted as a square wave to the control grid of the second amplifying stage V3, which has a gain of $A_2$. The output of this second stage V3 is filtered and rectified in the circuit comprising the series condenser C3, series rectifier CR7 and shunt rectifier CR8, and is applied across shunt resistor R6 as a biasing voltage $E_0$ to the amplifier A1 being controlled.

As indicated in the specific embodiment of Fig. 1, biasing voltage $E_0$ is of negative polarity and equal in magnitude to $(A_1E_D-E_R)A_2$. There is thus provided a delayed automatic gain control system which avoids the use of direct-coupled amplifiers and permits the use of a stable direct-current voltage as a reference level. The potentiometer P1 and resistor R5 provide means for adjusting the amount of the direct-current reference voltage applied to the diode circuit. This controls the automatic gain control threshold and consequently the output level of the amplifier being controlled.

The circuit of another delayed automatic gain control system in accordance with the invention is shown in Fig. 2. This circuit is adapted to controlling a multistage constant output amplifier such as the amplifiers designated A15, A16, A17, and A18 in Fig. 3 of the parent application. The controlled amplifier may be a four-stage amplifier as shown at A8, A9, A10, and A11 of Fig. 2 of this application.

As shown in Fig. 2, this circuit consists of an amplifying tube V5, a twin diode tube V6, amplifier V7, which may comprise one or more vacuum tube stages, and the rectifiers CR9 and CR10, which may be germanium varistors, in series and shunt, respectively, with the output of amplifier stage V7.

The operation of this circuit in providing the delayed automatic gain control voltage is as follows: (1) the output from the constant output amplifier A8, A9, A10, A11 is first amplified in the buffer amplifier V5; (2) the peak-to-peak value of the output from V5 is compared in the diode tube V6 with a direct-current voltage applied to one of the cathodes of that tube. This direct-current voltage provides a back-bias on the diode circuit and prevents transmission of the alternating-current signal from the output of tube V5 through the cathode-to-plate of the output diode of the tube V6 except when the peak-to-peak value of the alternating signal exceeds the bias voltage. This results in a series of voltage pips, one for each alternating-current cycle, across the load resistor R8 in the output of the twin diode V6. Each pip represents the amount that the peak-to-peak value of its cycle exceeds the bias voltage.

At this point, the pips contain unwanted portions of the original alternating-current wave due to transmission through the cathode-to-plate capacity of the diode. This alternating-current component is removed by: (1) attenuating the output of the twin diode V6 by means of the series resistors R9, R10, R11 by an amount equal to the ratio between the signal levels at the cathode and plate of the amplifier tube V5; (2) adjusting, by means of the variable capacitor C4 connected across the cathode resistor of the amplifier tube V5, the phase of the signal appearing at the cathode of the tube V5 so that it is exactly one hundred and eighty degrees out of phase with the signal at the plate of that tube; and (3) combining this cathode signal with the attenuated output of the twin diode V6 through the capacity of the variable capacitor C5 connected between the cathode of tube V5 and the control grid of the first amplifier stage in amplifier V7.

The capacity of the variable capacitor C5 is adjusted to be equal to the cathode-to-plate capacity of the diode tube V6. This provides a cancellation of the contaminating alternating-current signal component with the result that only the direct-current pips appear across the load resistor R11 shunting the grid and cathode of the input tube of amplifier V7. The adjustable resistor R12 connected between the positive terminal of the direct-current voltage source and the cathode of the first diode of tube V6 provides a means of adjusting the value of the back-bias on the diodes and therefore the automatic gain control threshold of the system.

The resulting pips are amplified in the two-stage amplifier V7 and filtered and rectified in a circuit including capacitor C3 and rectifiers CR9 and CR10. The rectified output of this circuit is applied across shunt resistor R15 as a bias voltage to the grids of the associated constant output amplifier tubes A8, A9, A10 and A11.

It can be seen that this automatic gain control system provides no bias on the grids of the controlled amplifier tubes until the output of that amplifier exceeds the critical value provided by the adjustable potentiometer control R12 for the automatic gain control circuit just described. However, when the output does exceed this critical value, bias is provided to reduce the gain of the controlled amplifier and thus tends to hold its output constant. The gain of the automatic gain control system is made sufficient to maintain the output of the controlled amplifier constant to $\pm 0.1$ decibel for input levels which vary from 0 dbm. (decibels referred to one milliwatt) to $-50$ dbm.

The above-described scheme of comparing an alternating-current wave with a direct-current reference voltage and deriving a differential alternating-current output has other possible applications. For example, it could be used as a stable expanded scale detector; to obtain a range of amplifier outputs which would be precisely determined by an adjustable direct-current reference voltage; or, as a simple but accurate level control for an amplifier or oscillator.

Various modifications of the circuits described above and illustrated in the drawings which are within the spirit and scope of the invention will occur to persons skilled in the art.

What is claimed is:

1. In combination, an alternating-current signal amplifier including one or more amplifying vacuum tube stages each including a control grid, and a delayed automatic gain control circuit for said amplifier comprising a first vacuum tube amplifying device including a cathode, anode, control grid and a cathode resistor and bridged across the output of said signal amplifier for selecting and amplifying one energy portion of the alternating-current signal in the output of that amplifier; a rectifier comprising a twin diode circuit supplied with the resulting amplified one signal portion; a reference source of direct-current voltage providing a back-bias on said diode circuit such as to prevent transmission of the alternating-current signal therethrough except when the peak-to-peak value of the applied alternating-current signal exceeds the bias voltage; means for selecting a series of voltage pips, one for each cycle of the applied voltage representing the amount that the peak-to-peak value of the amplified one signal portion of each cycle exceeds the back-bias voltage appearing in the output of said rectifier; means for effectively removing the alternating-current components from said series of pips comprising resistance means for attenuating the diode output by an amount equal to the ratio between the levels of said one signal portion at the anode and cathode of said first amplifying device; a variable capacitive means connected across said cathode resistor for adjusting the phase of the one signal portion appearing at the cathode of said first device to make it exactly one hundred and eighty degrees out of phase with respect to the one signal portion at the anode of said device, other variable capacitance means connected between the output of said attenuating means and the cathode of said first device for combining the signal at its cathode with the attenuated output of said diode circuit to make the capacitance therebetween substantially equal to the capacitance between the output and input of said diode circuit; means for amplifying and rectifying the resulting voltage pips; and means for applying the output of said last-mentioned pips as a bias to the grids of said amplifier to hold its voltage output constant.

2. In combination, an alternating-current signal amplifier including one or more amplifying vacuum tube stages, each including a control grid, and a delayed automatic gain control circuit for said amplifier comprising means for detecting a portion of the output voltage of said amplifier, vibrating relay means for interrupting the detected signal voltage portion at a sixty-cycle rate to produce sixty-cycle square waves having a peak-to-peak amplitude which is equal to that of said detected signal voltage portion, means for amplifying the resulting square waves, a diode circuit supplied with square waves from the latter amplifying means, a source of reference direct-current voltage for back-biasing said diode circuit, said diode circuit operating to compare the applied square waves on a peak-to-peak basis with said reference direct-current voltage, the back-bias voltage on said diode circuit preventing transmission through said diode circuit until the peak-to-peak value of the applied square wave exceeds the reference direct-current voltage whereupon a pip is produced in said diode circuit output, means for amplifying and rectifying the pips appearing in the output of said diode circuit, and means for applying the rectified pips as a bias to the control grids of said one or more amplifier stages to hold its voltage output constant.

3. In combination, an amplifier whose output voltage is to be maintained substantially constant at a predetermined maximum level, said amplifier having at least a control electrode, and a delayed automatic gain control connected to said amplifier and operating on an alternating-current basis, said control comprising first alternating-current amplifying means, means for applying a portion of the output voltage of said amplifier to the input of said first amplifying means, an amplitude comparator circuit having a preselected fixed amount of direct-current reference voltage for establishing therein a threshold transmission level which is proportional to said predetermined maximum output voltage level of said amplifier, said fixed reference voltage preventing said comparator circuit from producing an output voltage until the output voltage of said amplifier tends to exceed said predetermined maximum output level thereof whereupon said comparator circuit produces voltage pips which are proportional in amplitude to the excess of the amplitude of the voltage output of said amplifier above said predetermined maximum output level thereof, means for applying the output of said first amplifying means to the input of said comparator circuit, second alternating-current amplifying means connected to the output of said comparator circuit for amplifying the voltage pips received therefrom and representing the last-mentioned excess output voltage amplitude of said amplifier, means for detecting the amplified voltage pips in the output of said last-mentioned amplifying means to provide a direct-current voltage of negative polarity, and means for applying the detected negative voltage in the output of said detecting means to said control electrode of said amplifier thereby substantially maintaining the output voltage thereof at said predetermined maximum level.

4. The combination in accordance with claim 3 which includes means in series connection between the output of said amplifier and the input of said first alternating-current amplifying means comprising means for detecting a portion of the output of said amplifier to provide a direct-current voltage, means for converting the detected direct-current voltage output portion of said amplifier into periodic square waves having a peak-to-peak amplitude at least equal to that of said amplifier output portion, and means for applying said square waves to the input of said comparator circuit.

5. The combination in accordance with claim 4 wherein said converting means comprises vibrating relay means for periodically short-circuiting the output of said detecting means at a predetermined rate thereby converting the detected direct-current voltage into periodic square waves having a rate corresponding with said predetermined rate.

6. In combination, an amplifier whose output is to be maintained substantially constant at a predetermined level, said amplifier having at least a control electrode, and a delayed automatic gain control for said amplifier, said control amplifying an automatic gain control voltage on an alternating-current basis and comprising first alternating-current amplifying means including control grid, anode and cathode circuits, means for applying a portion of the output of said amplifier to said control grid and cathode circuits of said first amplifying means, an amplitude comparator circuit having a threshold level of transmission proportional to said predetermined amplifier output level for producing voltage pips proportional in amplitude to the excess of said amplifier output above said predetermined level, means for applying the output from said anode and cathode circuits of said first amplifying means to the input of said comparator circuit, means for effectively removing spurious alternating-current components from the output of said comparator circuit, said removing means comprising a resistor connected in said cathode circuit of said first amplifying means for developing thereacross a voltage proportional to the output of said amplifier, means having its input connected to the output of said comparator circuit for attenuating the output of said comparator circuit by an amount equal to the ratio between the levels of the signal portion at said anode and cathode circuits of said first amplifying means, a first variable capacitor connected in shunt with said cathode resistor for adjusting the phase of said voltage developed across said cathode resistor exactly one hundred eighty degrees out of phase with the voltage in said anode circuit, and means for coupling said last-mentioned cathode voltage portion from said cathode resistor and capacitor to the output of said attenuating means, said coupling means comprising a second variable capacitor adjusted to equal the capacitance inherent between the output and input of said comparator circuit, second alternating-current amplifying means connected to the output of said attenuating means for amplifying the voltage pips received therefrom, means for detecting the output of said second amplifying means, and means for applying said detected output to said control electrode.

7. The combination in accordance with claim 3 in which said amplitude comparator comprises twin diode rectifier means, each diode comprising an anode and a cathode, said anode of a first diode of said twin diode and said cathode of a second diode of said twin diode connected to said anode circuit of said first amplifying means, said anode of said second diode connected to the input of said attenuating means, a source of unidirectional voltage, and means for applying a predetermined amount of said last-mentioned voltage to said cathode of said first diode for establishing said threshold level in said comparator circuit.

References Cited in the file of this patent

UNITED STATES PATENTS

| | | |
|---|---|---|
| 2,153,752 | Gurtler | Apr. 11, 1939 |
| 2,297,543 | Eberhardt et al. | Sept. 29, 1942 |
| 2,390,850 | Singer | Dec. 11, 1945 |
| 2,462,452 | Yates | Feb. 22, 1949 |
| 2,533,253 | Howard | Dec. 12, 1950 |
| 2,535,325 | Smeltzer | Dec. 26, 1950 |
| 2,548,822 | Roberts et al. | Apr. 10, 1951 |
| 2,611,832 | Lapostolle | Sept. 23, 1952 |